United States Patent [19]

Havemann

[11] Patent Number: 5,403,759

[45] Date of Patent: Apr. 4, 1995

[54] METHOD OF MAKING THIN FILM TRANSISTOR AND A SILICIDE LOCAL INTERCONNECT

[75] Inventor: Robert H. Havemann, Garland, Tex.

[73] Assignee: Texas Instruments Incorporated, Dallas, Tex.

[21] Appl. No.: 955,942

[22] Filed: Oct. 2, 1992

[51] Int. Cl.⁶ ............................................ H01L 21/265
[52] U.S. Cl. .................................... 437/40; 437/41; 437/52; 437/200; 257/903; 257/67; 257/69
[58] Field of Search .................. 257/903, 67, 69; 437/40, 41, 52

[56] References Cited

U.S. PATENT DOCUMENTS

| | | |
|---|---|---|
| 4,821,085 | 4/1989 | Haken et al. |
| 4,873,204 | 10/1989 | Wong et al. ..................... 437/200 |
| 4,889,829 | 12/1989 | Kawai ............................. 437/69 |
| 5,302,538 | 4/1994 | Ishikawa et al. ................ 437/200 |
| 5,302,539 | 4/1994 | Haken et al. .................... 437/41 |
| 5,306,667 | 4/1994 | Shappir .......................... 437/200 |

Primary Examiner—Brian E. Hearn
Assistant Examiner—Lynne A. Gurley
Attorney, Agent, or Firm—Ruben C. DeLeon; James C. Kesterson; Richard L. Donaldson

[57] ABSTRACT

A method of fabricating a transistor on a wafer including; forming a doped transistor body 42 on top of an insulator 34; doping source/drain regions in the transistor body; forming a gate oxide 44 on top of the transistor body; forming sidewall spacers along the transistor body; depositing a metal layer over the transistor body; forming an amorphous silicon layer over the metal layer, the amorphous silicon layer patterned in a gate and a local interconnect configuration; annealing to form silicided regions above the source/drain regions within the transistor body, and where the metal layer reacts with the amorphous silicon layer to create a silicided gate 50 and a silicided local interconnect 50; and etching unsilicided portions of the metal layer to leave silicided source/drain regions, a silicided gate, and a silicided local interconnect.

6 Claims, 5 Drawing Sheets

METHOD OF MAKING THIN FILM TRANSISTOR AND A SILICIDE LOCAL INTERCONNECT

FIELD OF THE INVENTION

This invention generally relates to the manufacture of semiconductor devices with poly gates and silicided local interconnects.

CROSS-REFERENCE TO RELATED APPLICATIONS

The following coassigned patent applications are hereby incorporated herein by reference:

| Serial No. | Filing Date | Inventor |
| --- | --- | --- |
| 07/924209 | August 4, 1992 | Havemann |

BACKGROUND OF THE INVENTION

Without limiting the scope of the invention, its background is described in connection with high density metal-oxide-semiconductor (MOS) devices, and more particularly, to a high density metal-oxide-semiconductor structure which has metal silicide regions in the doped regions, in the top region of polysilicon gate and in the local interconnects.

Since the invention of the integrated circuit, work has been done to increase the number of components per unit of chip area and to improve device performance. The first integrated circuits were bipolar devices and used the junction isolation technique. However, as the demand for smaller and smaller devices increased, new technologies were developed which had higher packing density than bipolar devices. The self-aligned metal-oxide-semiconductor devices have now substantially replaced bipolar devices where very high packing density is required, such as in memories and microprocessors. As the demand for faster, higher density metal-oxide-semiconductor devices continues, improvements in fabrication technology are necessary to keep pace with the demand.

In the manufacture of very high density and high performance MOS VLSI devices such as the RISC microprocessors and 4-Megabit static RAMS (SRAMS), the electrical resistance of small-geometry elements has generally necessitated the use of a silicide cladding for polysilicon and source/drain regions. A self-aligned silicide, or "salicide" process is typically used to provide this cladding, and may be combined with a local interconnect to achieve smaller SRAM cell size. See U.S. Pat. No. 4,821,085 issued to Haken et al. on Apr. 11, 1989. Some SRAMS utilize 6 "single-crystal" transistor cells (the source/drains and channels are single crystal, and generally of silicon). Smaller SRAM cell size can also be achieved by using a polysilicon resistor load (e.g. in a 4 single crystal transistor/2 resistor cell) or a polycrystalline thin film transistor (TFT) load device (e.g. in a 4 single crystal transistor/2 polycrystalline transistor cell).

Heretofore, in this field, TFT devices are normally formed by using one layer of polysilicon for the transistor body and another (overlying or underlying) layer of polysilicon for the transistor gate, with a gate oxide in between. This approach places severe constraints on the process in terms of low temperature processing and hinders the use of silicides to lower the resistance of the polysilicon and the source/drain regions.

SUMMARY OF THE INVENTION

It is herein recognized that a need exists for thin film transistors with metal gates which are compatible with the use of silicides and local interconnects. The present invention is directed towards meeting those needs.

Generally, and in one form of the invention, the structure while also requiring a certain degree of limited thermal processing, is totally compatible with the use of a local interconnect such as titanium disilicide, for example. This invention describes a structure and method for forming a MOS field effect transistor (e.g. a TFT load device) using a polysilicon body deposited on an insulator with an overlying gate oxide and silicided polysilicon gate.

An advantage of the invention is that a silicide on the top portion of the polysilicon gate can be made at the same time as silicide over the source/drain regions of the TFT device and of the silicide of the substrate source/drains of single crystal transistors, and the silicide over the local interconnect. The metal may consist of titanium and the resulting silicide would be $TiSi_2$. Alternately, other metals (for example, cobalt, or nickel) could also be used along with the corresponding resulting silicides. In addition, another advantage to the invention would be the use of a TFT gate and local interconnect material to provide circuit connections for the TFT without requiring a separate contact level. Furthermore, using an (e.g. isotropic wet) etch to remove the excess metal above the substrate source/drain regions, would self-align the silicide interconnect with the substrate source/drain regions. Thus a silicide is formed which serves as the gate of the TFT device, and as an interconnect, and preferably as a self-aligned contact to a substrate source/drain. The source/drains of the TFT and polysilicon gates of single crystal transistors may be silicided at the same time.

This is a method of fabricating a transistor on a wafer. The method comprises: forming a doped transistor body on top of an insulator; doping source/drain regions in the transistor body; forming a gate oxide on top of the transistor body; forming sidewall spacers along the transistor body; depositing a metal layer over the transistor body; forming an amorphous silicon layer over the metal layer, the amorphous silicon layer patterned in a gate and a local interconnect configuration; annealing to form silicided regions above the source/drain regions within the transistor body, and where the metal layer reacts with the amorphous silicon layer to create a silicided gate and a silicided local interconnect; and etching unsilicided portions of the metal layer to leave silicided source/drain regions, a silicided gate, and a silicided local interconnect.

Alternately, the metal layer is annealed before forming the amorphous silicon layer, to create the silicided regions above the source/drain regions, then removing unsilicided portions of the metal layer, and then depositing a second metal layer over the transistor body, all before forming the amorphous silicon layer.

Alternately, the source/drain regions can be implanted after the formation of the TFT gate.

BRIEF DESCRIPTION OF THE DRAWINGS

The foregoing and further aspects of the invention are illustrated in the accompanying drawings wherein like elements are denoted by like reference designators and in which.

DETAILED DESCRIPTION OF PREFERRED EMBODIMENTS

The term metal-oxide-semiconductor (MOS) is defined for purposes of this disclosure as including structures in which an insulator (or combination of insulators) is sandwiched between a conductor and a semiconductor. This definition will be understood to include structures where polycrystalline silicon is the conductor.

FIGS. 1–7 depict successive stages of the first embodiment of the manufacture of MOS field effect transistors shown in cross-section.

Figure 1:
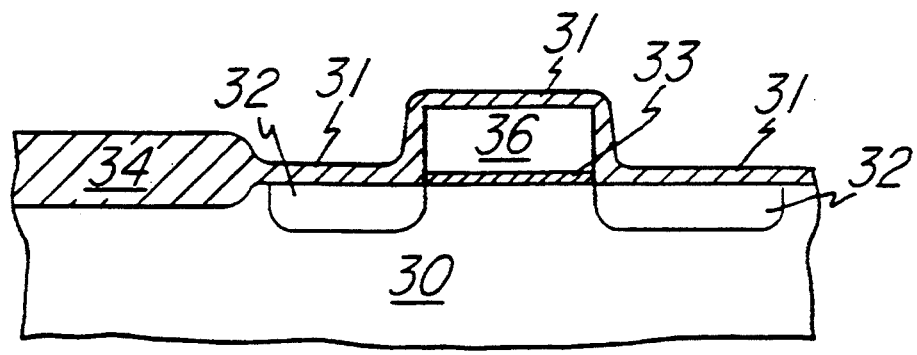
FIGS. 1–7 are cross sectional elevation views of the first preferred embodiment and the steps of the preferred embodiment fabrication method.

(a) In FIG. 1, a polysilicon gate transistor is made by conventional methods. The transistor is composed of an oxide 31 on the top of, as well as, along the side of the polysilicon gate 36 and the source/drain regions 32. The gate oxide 33 separates the polysilicon gate from the substrate 30. A field oxide 34 is utilized for isolation purposes.

Figure 2:
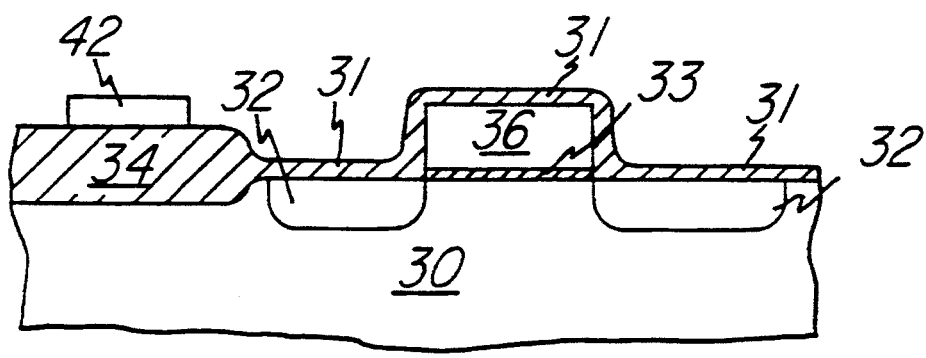

(b) In FIG. 2, a layer of polysilicon is deposited and etched into a transistor mesa 42 on top of the field oxide 34. Before pattern and etch, the appropriate dopant is implanted to make the NMOS or PMOS transistor body. Additional dopant may be added to make the threshold voltage in the channel area. The orientation of the transistor mesa 42 is the opposite of the other depicted polysilicon gate transistor as shown in FIG. 2.

Figure 3:
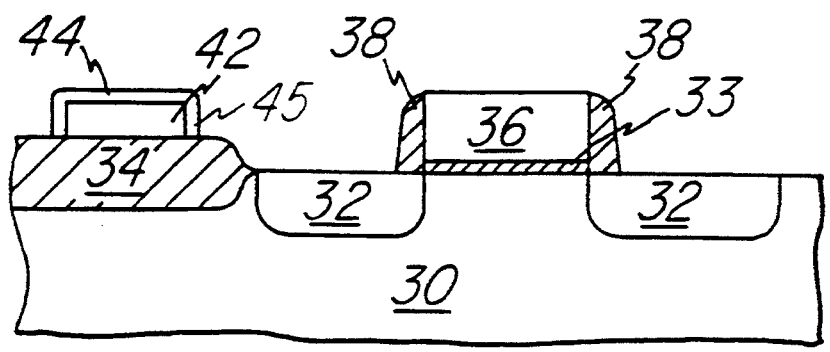

(c) In FIG. 3, a gate oxide 44 is grown over the transistor mesa 42 and then patterned and etched to leave gate oxide over the TFT gate region and remove oxide from regions 32 and 36, and leaving sidewall spacers 38. The oxide which makes up the gate oxide 44 on the TFT also provides oxide for the sidewalls 45.

Figure 4:
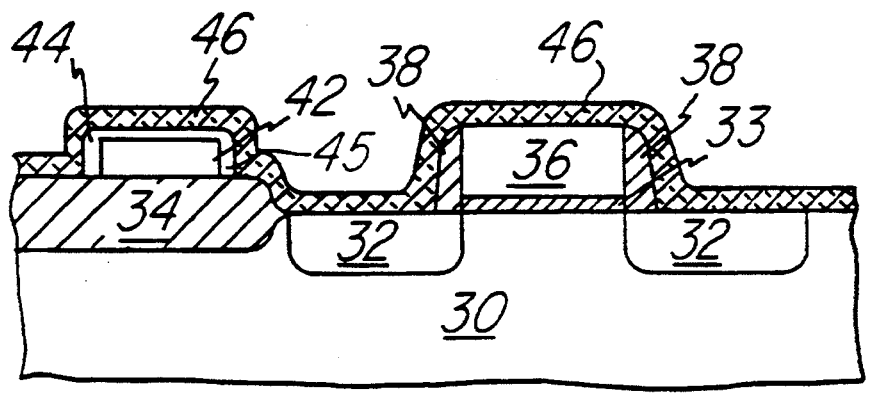

(d) In FIG. 4, a layer of metal 46 is deposited over the polysilicon gate 36, the sidewall spacers 38, the source/drain regions 32, the field oxide 34, the transistor mesa 42, and gate oxide 44 (the metal could, for example, be titanium or cobalt).

Figure 5:
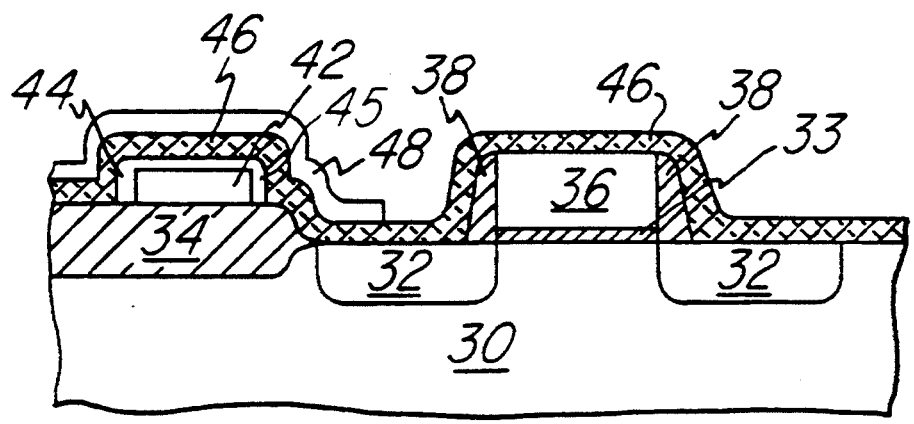

(e) In FIG. 5, an amorphous silicon layer 48 is deposited, patterned and etched over the metal layer 46. The amorphous silicon layer 48 is patterned in a TFT gate and local interconnect configuration.

Figure 6:
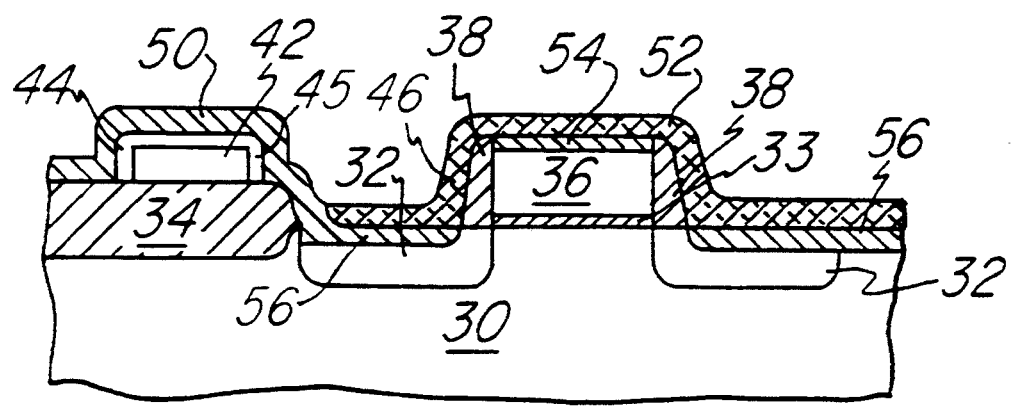

(f) In FIG. 6, annealing forms silicided regions in the source/drain regions within the transistor mesa 42, silicided regions 56 over the source/drain regions 32 and silicided polysilicon gate 54 on top of the polysilicon gate 36. Furthermore, annealing reacts the metal layer 46 with the amorphous silicon layer 48 (depicted in FIG. 5) to create a silicided local interconnect 50, which also serves as the TFT gate.

Figure 7:
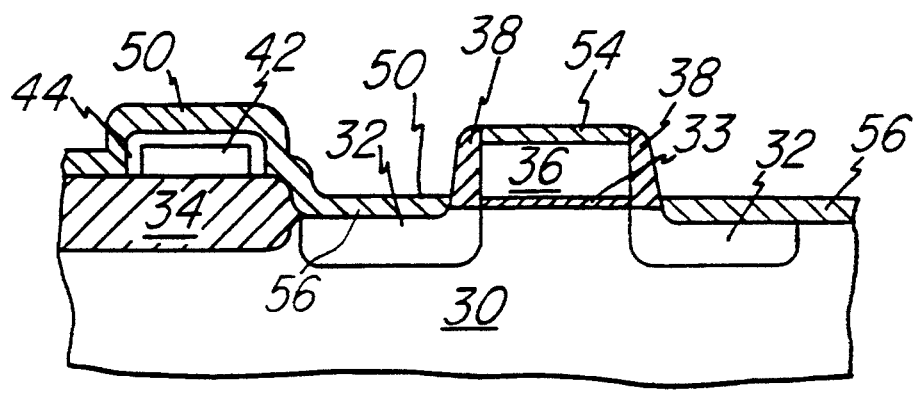

(g) In FIG. 7, the unsilicided metal (Ti) 46 (shown in FIG. 6) is etched leaving the structure shown. Alternately the source/drain regions of the transistor mesa 42 could be doped after this step, instead of at paragraph (b). This would allow for the source/drain doping to be self-aligned to the TFT gate 50.

Figure 8:
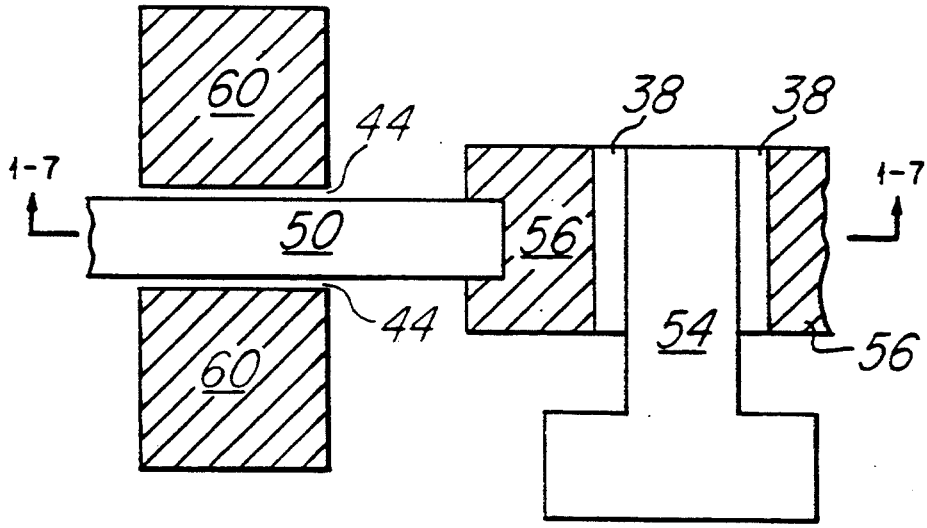
FIG. 8 is a top view in section of a part of a semiconductor integrated chip showing a TFT transistor along with a poly gate transistor made according to the invention thereof.

(h) In FIG. 8, a top view of the transistors formed in steps 1–7 is shown. The silicided local interconnect 50 is shown to act as the metal gate of the transistor mesa, and connect to the source/drain region 56 of the other depicted transistor. The silicided polysilicon gate 54, sidewall spacers 38 and silicided source/drain portions 56 are shown to depict their respective locations on the second transistor. The silicided source/drain regions 60 of the TFT are also shown in the figure. The common label numbers between FIGS. 1–4 and 9–14 have the same description. However, the new labels in FIGS. 9–14 are primed to show a different process sequence. Additionally, the sidewall spacers 44 of the TFT are also shown. Note, the sidewall spacers 44 shown in FIG. 8 are perpendicular to those shown in FIG. 3.

Figure 9:
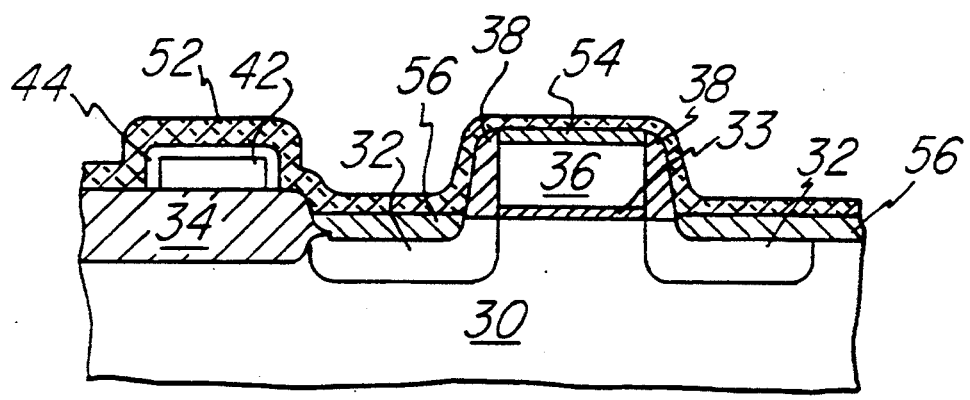
FIGS. 9–14 are cross sectional elevation views of the second preferred embodiment and the steps of the second preferred embodiment fabrication method.

FIGS. 9–13 depict successive stages of the second embodiment of the manufacture of MOS field effect transistors shown in cross-section. The procedure is identical to the first embodiment up through FIG. 4. FIG. 9 starts off after FIG. 4.

(i) In FIG. 9, the source/drain regions within the transistor mesa 42 are reacted with the refractory metal to form a silicided source/drain region (which is region 60 in FIG. 8 but not shown in this cross-sectional view). The region above the source/drain regions 32 also create a silicide 56', along with the silicide 54' created on top of the polysilicon gate 36. If the silicide reaction is performed with Ti as the metal in a nitrogen ambient, a TiN layer is formed from the top surface of refractory metal 46 (depicted in FIG. 4—this TiN layer may be substantially thinner above $TiSi_2$ regions than above the oxide regions). Region 52' depicts metal (or the TiN/Ti sandwich) above the oxide surfaces.

Figure 10:
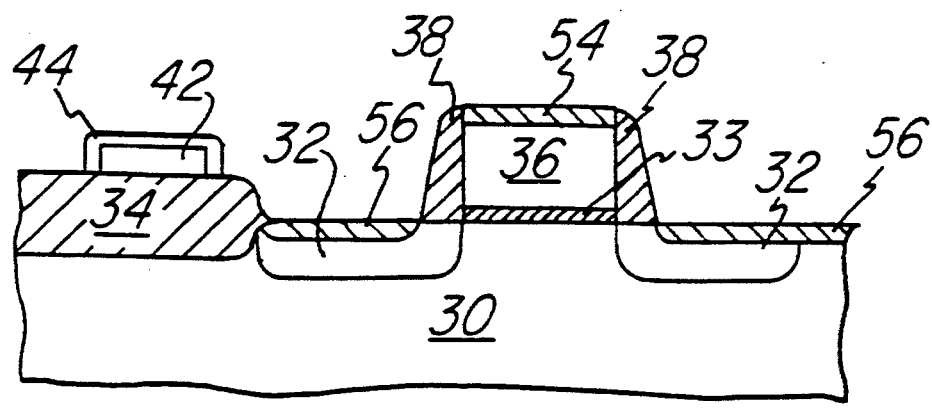

(j) In FIG. 10, the unsilicided metal and any metal nitride is removed to leave the silicided structure shown.

Figure 11:
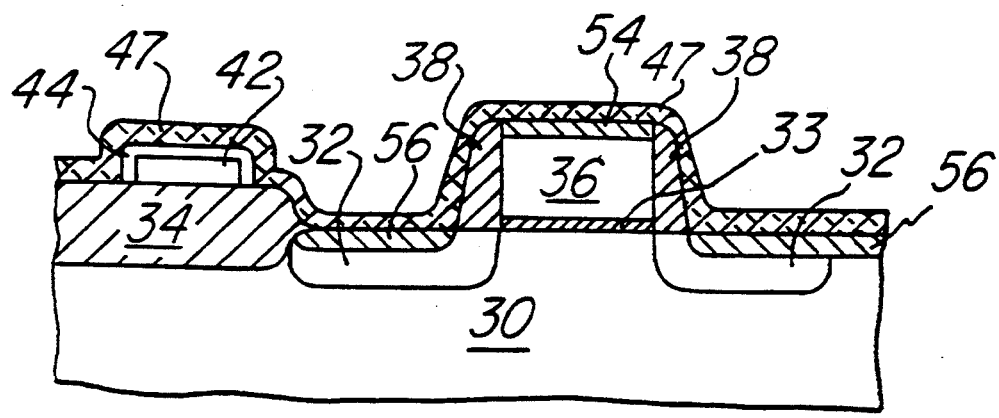

(k) In FIG. 11, a second layer of metal 47' is deposited over the silicided polysilicon gate 54', the sidewall spacers 38, the silicided substrate source/drain regions 56', the field oxide 34, and the transistor mesa 42 (the metal could, for example, be titanium or cobalt).

Figure 12:
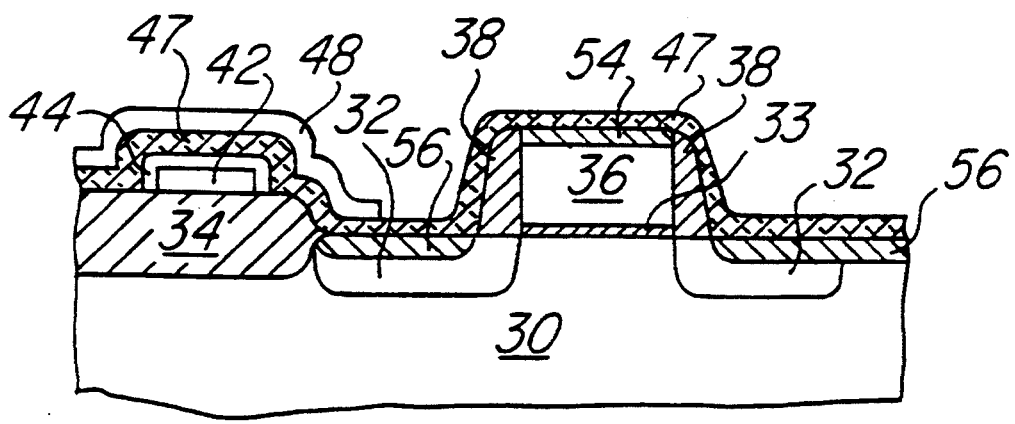

(l) In FIG. 12, an amorphous silicon layer 48' is deposited, patterned and etched over the second layer of metal 47'. The amorphous silicon layer 48' is patterned in a TFT gate and local interconnect configuration.

Figure 13:
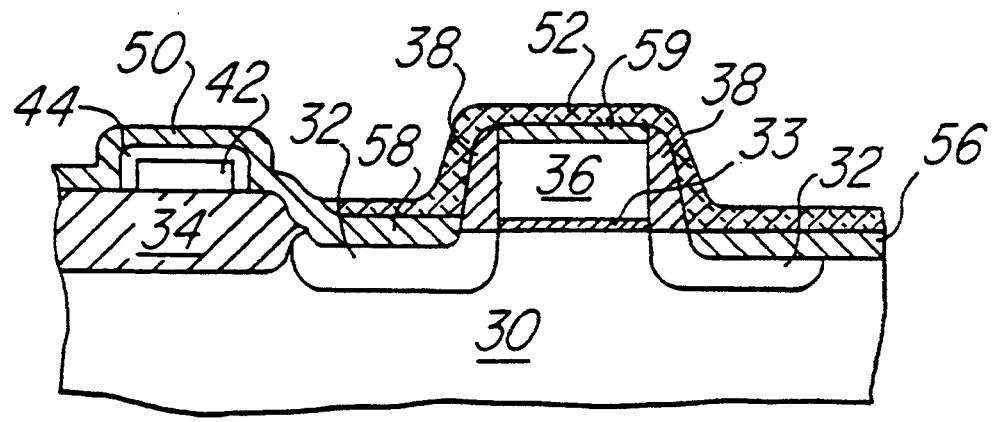

(m) In FIG. 13, annealing reacts the second layer of metal 47' (depicted in FIG. 12 where metal is in contact with the amorphous silicon layer 48' to create a silicided gate and local interconnect 50'. The reaction also forms thicker silicide regions over the silicided source/drain (56', depicted in FIG. 12) and silicide (54) to form a thicker silicided source/drain region 58' and a thicker silicided polysilicon gate 59' respectively in FIG. 13.

Figure 14:
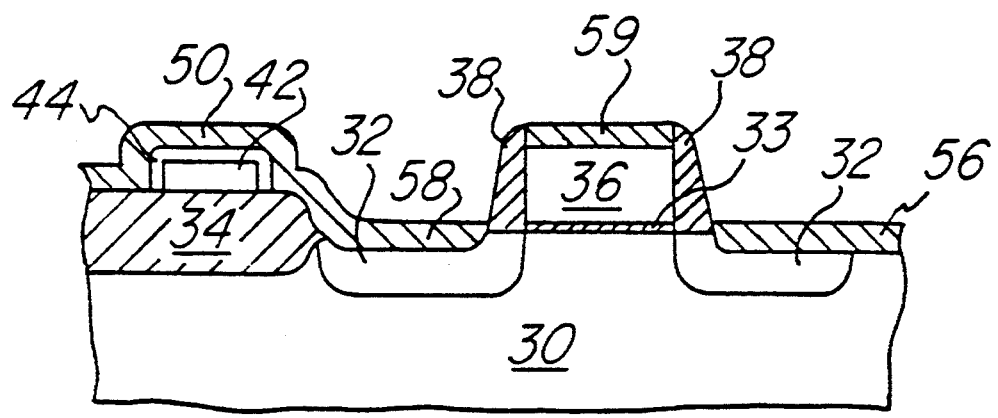

(n) In FIG. 14, the unsilicided metal is etched leaving the structure shown.

Alternately, the silicide reaction can be performed with the metal in an inert atmosphere instead of the nitrogen ambient. In addition, the substrate could be made out of single crystal silicon, polycrystalline silicon or an silicon on insulator (SOI) substrate.

A few preferred embodiments have been described in detail hereinabove. It is to be understood that the scope of the invention also comprehends embodiments different from those described, yet within the scope of the claims. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of fabricating a thin film transistor on a wafer comprising:
   a. forming a MOS first transistor with source/drain regions on a substrate;
   b. forming an insulator on said substrate adjacent to said first transistor;
   c. forming a doped second transistor body on top of said insulator;
   d. doping source/drain regions in said second transistor body;
   e. forming a gate oxide on top of said second transistor body;
   f. depositing a first metal layer over said second transistor body;
   g. annealing said first metal layer to create said silicided regions above said source/drain regions;
   h. removing unsilicided portions of said first metal layer;
   i. depositing a second metal layer over said second transistor body;
   j. forming an amorphous silicon layer over said second metal layer, said amorphous silicon layer patterned in a TFT gate and a local interconnect configuration;
   k. annealing to form silicided regions above said source/drain regions within said second transistor body, and where said second metal layer reacts with said amorphous silicon layer to create a silicided gate and a silicided local interconnect; and
   l. etching unsilicided metal to leave silicided source/drain regions, a silicided TFT gate and a silicided local interconnect.

2. The method of claim 1, wherein sidewall spacers are formed along said second transistor body after forming a gate oxide on top of said transistor body.

3. The method of claim 1, wherein said source/drain regions of said first transistor are silicided simultaneously with said source/drain regions of said second transistor body.

4. The method of claim 1, wherein said metal is a refractory metal and the silicide is the corresponding silicide compound.

5. The method of claim 1, wherein said gate is formed simultaneously with a local interconnect.

6. A method of fabricating a thin film transistor on a wafer comprising:
   a. forming a first transistor with source/drain regions on a substrate, wherein said first transistor is a transistor other than a thin film transistor;
   b. forming an insulator on said substrate adjacent to said first transistor;
   c. forming a doped second transistor body on top of said insulator;
   d. doping source/drain regions in said second transistor body;
   e. forming a gate oxide on top of said second transistor body;
   f. forming sidewalls on said second transistor body;
   g. depositing a first metal layer over said second transistor body;
   h. annealing said first metal layer to create said silicided regions above said source/drain regions;
   i. removing unsilicided portions of said first metal layer;
   j. depositing a second metal layer over said second transistor body;
   k. forming an amorphous silicon layer over said second metal layer, said amorphous silicon layer patterned in a TFT gate and a local interconnect configuration;
   l. annealing to form silicided regions above said source/drain regions within said second transistor body, and where said second metal layer reacts with said amorphous silicon layer to create a silicided gate and a silicided local interconnect; and
   m. etching unsilicided metal to leave silicided source/drain regions, a silicided TFT gate, and a silicided local interconnect.

* * * * *